(12) United States Patent
Blaum et al.

(10) Patent No.: US 7,696,908 B2
(45) Date of Patent: Apr. 13, 2010

(54) TECHNIQUES FOR REDUCING ERROR PROPAGATION USING MODULATION CODES HAVING A VARIABLE SPAN

(75) Inventors: Mario Blaum, San Jose, CA (US); Ksenija Lakovic, San Jose, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 1136 days.

(21) Appl. No.: 11/326,357

(22) Filed: Jan. 4, 2006

(65) Prior Publication Data

US 2007/0157067 A1 Jul. 5, 2007

(51) Int. Cl.
*H03M 7/00* (2006.01)
(52) U.S. Cl. .......................................... 341/80; 341/83
(58) Field of Classification Search .................. 341/80; 714/752, 784
See application file for complete search history.

(56) References Cited

U.S. PATENT DOCUMENTS

| | | | |
|---|---|---|---|
| 5,544,180 A * | 8/1996 | Gupta | 714/798 |
| 5,760,718 A | 6/1998 | Immink | |
| 7,030,789 B1 * | 4/2006 | Cideciyan et al. | 341/83 |
| 7,343,424 B2 * | 3/2008 | Amato | 709/241 |
| 2005/0114748 A9 * | 5/2005 | Shen et al. | 714/752 |

OTHER PUBLICATIONS

W. H. Kautz, "Fibonacci Codes for Synchronization Control," IEEE Transactions on Information Theory, Apr. 1965, pp. 284-292.

* cited by examiner

*Primary Examiner*—Rexford N Barnie
*Assistant Examiner*—Joseph Lauture
(74) *Attorney, Agent, or Firm*—Steven J. Cahill

(57) ABSTRACT

Techniques are provided for reducing error propagation in encoded data using Fibonacci modulation codes. The Fibonacci modulation codes have a Fibonacci base with a variable span that limits error propagation. Some of the elements in the Fibonacci base have a larger span than limited span elements in the base. Errors occurring in bit positions of an encoded sequence that correspond to the limited span elements do not propagate to adjacent bytes in the decoded sequence. The Fibonacci modulation codes can also have a relatively high code rate.

20 Claims, 3 Drawing Sheets

TECHNIQUES FOR REDUCING ERROR PROPAGATION USING MODULATION CODES HAVING A VARIABLE SPAN

BACKGROUND OF THE INVENTION

1. Field of the Invention

The present invention relates to modulation codes, and more particularly, to techniques for reducing error propagation using modulation codes having a variable span.

2. Description of the Related Art

Writing certain bit patterns on a magnetic hard disk can increase the risk of errors. For example, long recorded data sequences of the same polarity are examples of data bit patterns that are prone to errors. These data sequences correspond to long sequences of binary zeros in the NRZ (non return-to-zero) representation, or alternatively to long sequences of binary zeros in the NRZI or PR4 representations. Another example of error prone data bit patterns are long sequences of ones in the NRZI representation. Modulation codes have been developed to remove certain error-prone patterns from bit sequences.

A modulation code encodes input sequences to prevent certain error-prone bit patterns from appearing in the output sequences. Maximum transition run (MTR) codes are one class of modulation codes that are used in conjunction with a 1/(1+D) precoder. MTR codes limit runs of certain sequences of bits. As an example, an MTR code limits the maximum number (j) of consecutive ones in an encoded stream of bits in an NRZI representation.

Modulation encoding can be performed on data using a Fibonacci code, as taught by Kautz. A Fibonacci code uses a Fibonacci base, as opposed to a traditional base consisting of powers of 2. Each element of a base of a Fibonacci code is the sum of a fixed number j+1 of the previous elements of the base, for example j+1=3. A Fibonacci code with such a base limits the maximum number of consecutive 1s to j. In other words, MTR encoding using a Fibonacci base transforms a binary sequence from a standard binary representation to a representation that limits the maximal number of consecutive 1s to j. MTR decoding reverses the encoding process to reconstruct the original input sequence using the Fibonacci base.

A span of a base represents the maximum number of consecutive errors that a single error in an encoded sequence can propagate when decoded. For example, if a Fibonacci base has a span of 10, modulation encoding and decoding using the Fibonacci base can propagate errors up to 10 consecutive bits. Thus, if one bit is in error in the encoded sequence, the error can cause up to 10 consecutive bits to be in error in the decoded sequence.

Some Fibonacci modulation codes can be used to encode two or more bytes of data at a time. For example, a Fibonacci modulation code with a code rate of 20/21 can have a span of 20 (in a worst case situation). With a span of 20, one bit in error in the encoded sequence can cause up to 20 bits in the decoded sequence to be in error. If there are 10 bits in each byte, and the modulation code has a span of 20, an error in one byte can propagate into an adjacent byte. Modulation codes that allow errors to propagate into a large number of adjacent bits can reduce the reliability of a data recording system. In particular, modulation codes that allow errors to propagate into adjacent bytes are undesirable.

However, modulation codes that have a smaller span usually have a lower code rate. High code rates are preferred in modulation encoders, because a high code rate increases the efficiency of a data recording system in terms of storage space requirements.

It would therefore be desirable to provide techniques for reducing error propagation in modulation encoders using Fibonacci modulation codes that have a limited span and a relatively high code rate.

BRIEF SUMMARY OF THE INVENTION

The present invention provides techniques for reducing error propagation in encoded data using a Fibonacci modulation code. Fibonacci modulation codes of the present invention have a Fibonacci base with a variable span that limits error propagation.

Some of the elements in a Fibonacci base of the present invention have a larger span than limited span elements in the base. Errors occurring in bit positions of an encoded sequence that correspond to the limited span elements do not propagate to adjacent bytes in the decoded sequence. Modulation codes of the present invention can also have a relatively high code rate.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 3 illustrates seven elements of a Fibonacci base with a variable span having a 30/31 code rate, according to an embodiment of the present invention.

DETAILED DESCRIPTION OF THE INVENTION

Figure 1:
FIG. 1 illustrates a diagram of a variable span modulation encoding system, according to an embodiment of the present invention.

FIG. 1 illustrates a variable span modulation encoding and decoding system according to an embodiment of the present invention. A variable span modulation encoder 101 receives an input sequence. The input sequence (or a portion of it) can be previously encoded by an error-correcting code, such as a Reed-Solomon code, which is common practice in magnetic recording systems. The variable span modulation encoder 101 encodes the input sequence using a modulation code having a variable span to generate an encoded sequence. For example, variable span modulation encoder 101 can encode the input sequence using a variable span Fibonacci code.

The encoded sequence is transmitted to system 102. System 102 can be a data storage system that stores the data on a data storage medium or a data communication system that transmits data through a wired or wireless network. System 102 can be, for example, a hard disk drive that stores data on a magnetic or optical hard disk. System 102 can also be any other type of data storage system.

System 102 receives commands to read and write encoded sequences to the data storage medium or to transmit and receive encoded sequences along a communication channel. After system 102 reads or receives an encoded sequence, the encoded sequence is transmitted to variable span modulation decoder 103. Variable span modulation decoder 103 decodes the encoded sequence using the variable span modulation code to generate an output sequence that is, ideally, a reproduction of the original input sequence. However, in practice, errors can appear in the encoded sequences between the modulation encoder and the modulation decoder.

As discussed above, a Fibonacci code can be used as a base for a modulation encoder. A first example of a Fibonacci base is {717, 372, 193, 100, 52, 27, 14, 7, 4, 2, 1}. This Fibonacci code provides a modulation constraint that limits the number of consecutive ones to a maximum of 3 (j=3). Each element of this particular Fibonacci base equals the sum of the previous four elements. Since the base has 11 elements and the first element of the base (i.e., 717) satisfies $2^9<717<2^{10}$, this Fibonacci base provides a code of rate 10/11.

A Fibonacci modulation encoder transforms an input sequence from a standard binary representation to a representation that uses a Fibonacci base. For example, a modulation encoder can transform a 10-bit input sequence (1101001001=512+256+64+8+1=841) into an 11-bit encoded sequence (10010011011=717+100+14+7+2+1=841) using the example Fibonacci base given above.

The Fibonacci base {717, 372, 193, 100, 52, 27, 14, 7, 4, 2, 1} has a span equal to 10. The first element 717=1011001101, the second element 372=0101110100, the third element 193=0011000001, etc. The span can be determined by the number of bit positions between the first and the last 1s in the elements of the base. In the case of 717=1011001101, the first one is in location 1 and the last one in location 10, so the span is equal to 10, indicating the worst possible case. Because the span of the Fibonacci base equals 10, one error can propagate up to 10 bits, causing a first bit to be in error as well as another bit 10 locations away from the first bit to be in error in the decoded sequence. For example, the 10-bit input sequence (1011001110) equals 718 in decimal. The corresponding encoded sequence with respect to the Fibonacci base {717, 372, 193, 100, 52, 27, 14, 7, 4, 2, 1} is (10000000001). If the first bit is in error, the received sequence becomes (00000000001), which is decoded as (0000000001) by the decoder, instead of the original (1011001110).

A second Fibonacci base {640, 320, 192, 96, 48, 28, 14, 7, 4, 2, 1} is an example of a limited span Fibonacci base. This Fibonacci base has a span of 3, because 650=1010000000, 320=0101000000, 192=0011000000, 96=0001100000, etc. It can be seen that the first and the last 1 in any element of this Fibonacci base do not span more than 3-bit locations. Thus, a modulation encoding/decoding process using this second Fibonacci base can propagate errors up to 3 consecutive bits. For example, an input sequence (1010000001) equals 641 in decimal. The corresponding encoded sequence is (10000000001) in the Fibonacci base {640, 320, 192, 96, 48, 28, 14, 7, 4, 2, 1}. If the first bit is in error (i.e., the received sequence is 00000000001), the vector is decoded as (0000000001) instead of the original (1010000001). Thus, the error has propagated to only the first 3 bits.

The second Fibonacci base {640, 320, 192, 96, 48, 28, 14, 7, 4, 2, 1} is generated by taking the sum of the previous 4 elements of the base, and then, limiting the span of each element of the base to 3. The span of each element can be limited to 3 by setting all of the bits that are 3 or more bit positions to the right of the most significant bit equal to 0. However, limiting the span of all of the elements in a base in this fashion may decrease the code rate of the modulation encoder. Decreasing the rate is undesirable, because a modulation encoder with a smaller code rate generates codewords that require additional storage space.

An example of a Fibonacci base that can be used by a modulation encoder to generate a code of rate 20/21 is now discussed. In this example, it is assumed that the modulation encoder input bits are previously encoded by an error-correcting code, such as a Reed-Solomon code, which is common practice in magnetic recording systems. Also, it is assumed that the size of the Reed-Solomon byte is 10 bits.

Consider the Fibonacci base={596889, 314874, 157437, 83052, 41526, 21906, 10953, 5778, 2889, 1524, 762, 402, 201, 106, 53, 28, 14, 7, 4, 2, 1}. In binary, the elements of the base are [596889=10010001101110011001]; [314874= 01001100110111111010], etc. Since both the first and the last element of 596889=10010001101110011001 are 1, this Fibonacci base has a span of 20 (worst possible case). Thus, errors can propagate up to 20 bits. In particular, errors may also propagate between adjacent bytes, considering that the byte size equals 10 bits.

Figure 2:
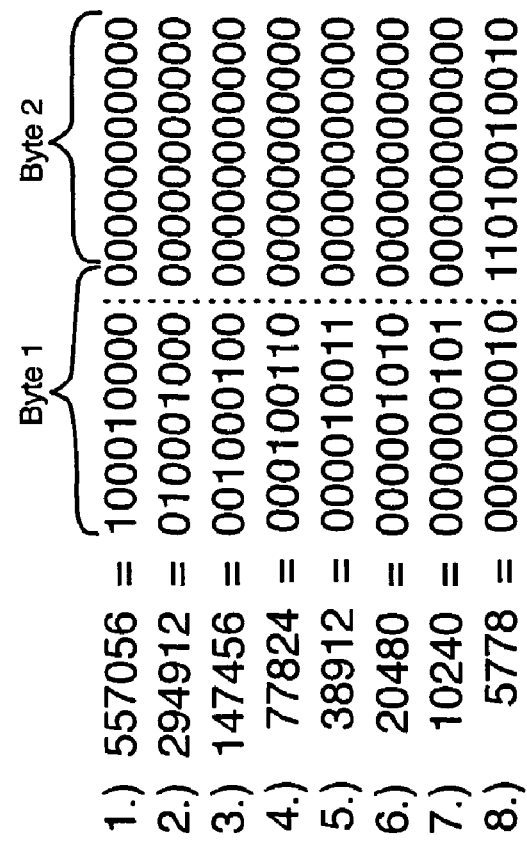
FIG. 2 illustrates eight elements of a Fibonacci base with a variable span having a 20/21 code rate, according to an embodiment of the present invention.

The techniques of the present invention can reduce error propagation by using variable span modulation codes. FIG. 2 illustrates eight elements of a Fibonacci base for a variable span modulation code of rate 20/21, according to an exemplary embodiment of the present invention. The modulation code has a Fibonacci base that is derived by alternately taking the sum of the previous 4 or 5 elements of the base. The base for this example Fibonacci modulation code is {557056, 294912, 147456, 77824, 38912, 20480, 10240, 5778, 2889, 1524, 762, 402, 201, 106, 53, 28, 14, 7, 4, 2, 1}. This Fibonacci modulation code provides an alternating j=3-4 constraint on the input sequence at a 20/21 code rate.

When the first seven elements of this Fibonacci base are converted to binary, it can be seen that the first five elements of the base have a limited span equal to 5, while elements 6 and 7 have a span of 3, as shown in FIG. 2. The limited span of the first seven element of the Fibonacci base is shown by the dotted line in FIG. 2. The 11 bit positions to the right of the dotted line are all zeros in the first seven elements of the base. If an error has occurred in one of the first 7 bits of the received 21-bit vector, errors are confined to the first byte only.

To decode a sequence that has been encoded in a Fibonacci base, each bit in the encoded sequence is multiplied by a corresponding element of the Fibonacci base. Then, the results of the multiplications are summed together to generate a decoded representation of the encoded sequence. Because the second byte (i.e., the second 10 bits) of the first seven elements of the variable span Fibonacci base are all zeros, errors that occur in the first seven bits of an encoded sequence cannot propagate to the second byte (byte 2) in the decoded sequence.

Thus, if an error occurs in one of the first 7 bits of an encoded sequence, when the bit in error is multiplied by a corresponding element of the Fibonacci base of FIG. 2, the result of the multiplication always has 11 zeros in the least significant bit positions, regardless of the value of the bit in error. Therefore, when the results of the multiplications for all of the bit positions are added together to decode the Fibonacci base representation, an error in the first 7 bits of the encoded sequence will not affect any of the resulting bits in byte 2 of the decoded sequence.

The fact that the last 11 bits are not affected when an error occurs in the first 7 bits (as opposed to the last 10 bits) allows for the use of a precoder, such as 1/(1+D). The precoder normally propagates errors an extra bit. So an error affecting bits 1 to 7 in the received sequence, when decoded, affects bits 1 to 9 in the decoded sequence. The inverse operation to the precoder (e.g., 1+D) may affect bits 1 to 10, leaving bits 11 to 20 (i.e., the second byte), unaffected.

The subsequent elements of the base (i.e., elements 8-21) have ones to the right of the dotted line shown in FIG. 2. Errors that occur in elements 8, 9 and 10 may cause error propagation such that both byte 1 and byte 2 in the decoded sequence are in error. Therefore, the modulation code of FIG.

2 prevents errors that occur in some (but not all) bits of an input sequence from propagating beyond the limited span of a subset of elements in the modulation code base.

Figure 3:
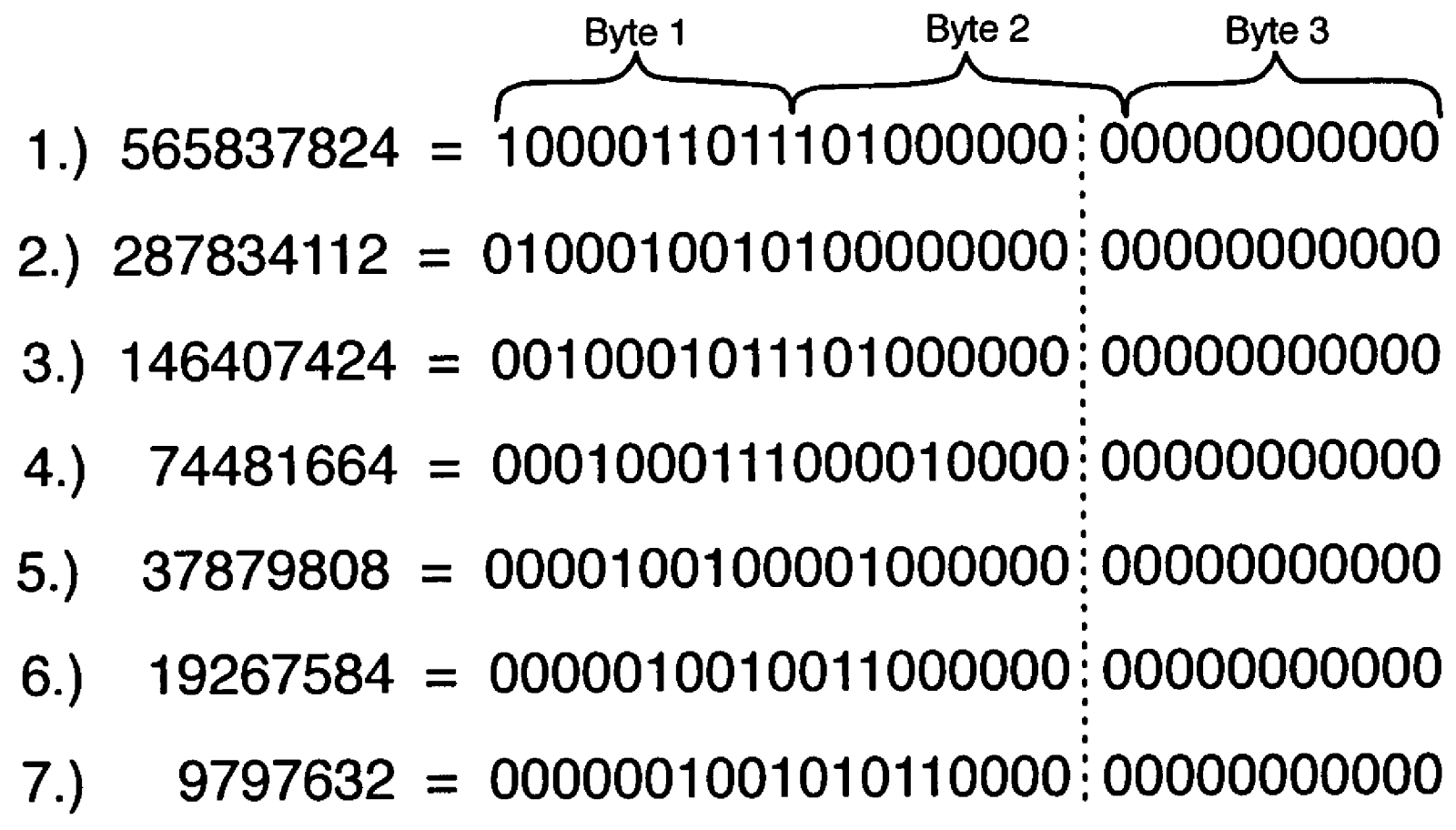

FIG. 3 illustrates seven elements of a Fibonacci base with a variable span, according to another embodiment of the present invention. The Fibonacci base is {565837824, 287834112, 146407424, 74481664, 37879808, 19267584, 9797632, 4997120, 2539520, 1294336, 655360, 335872, 172032, 86016, 45056, 22528, 12248, 6230, 3169, 1612, 820, 417, 212, 108, 55, 28, 14, 7, 4, 2, 1}. Each element of this Fibonacci base is derived by taking the sum of the previous 5 elements of the base. A modulation encoder using this Fibonacci base can provide a 30/31 code rate, and a fixed constraint of j=4 on the input sequence.

When the first seven elements of this Fibonacci base are shown in binary, it can be seen that the span of these seven elements of the base does not exceed 20, as shown in FIG. 3. The limited span of the first seven elements of the Fibonacci base is shown by the dotted line in FIG. 3. The 11 bit positions to the right of the dotted line are all zeros in the first seven elements of the base. Therefore, errors in the first 7 bits of a received encoded 31-bit sequence do not propagate beyond the first 19 bits of the decoded sequence. Even with a precoder, the last 10 bits (i.e., the third byte) of the decoded sequence is error free.

Because the least significant 11 bits (including byte 3 and one adjacent bit) of the first seven elements of the Fibonacci base in FIG. 3 are zero, errors that occur in any of the first 7 bits of an encoded sequence do not propagate to byte 3 of the decoded sequence. The fact that the least significant 11 bits are not affected when an error occurs in the first 7 bits allows for the use of a precoder, such as 1/(1+D).

Some of the other elements of the Fibonacci base have a span that is greater than 20. Thus, the Fibonacci base of FIG. 3 has a variable span in order to limit the number of errors in the third byte.

An error that occurs in a bit position greater than 7 may cause error propagation to byte 3 of the decoded sequence. Therefore, the modulation code of FIG. 3 prevents errors that occur in some (but not all) bits of an encoded sequence from propagating beyond the limited span of a subset of elements in the modulation code base.

Figure 4:
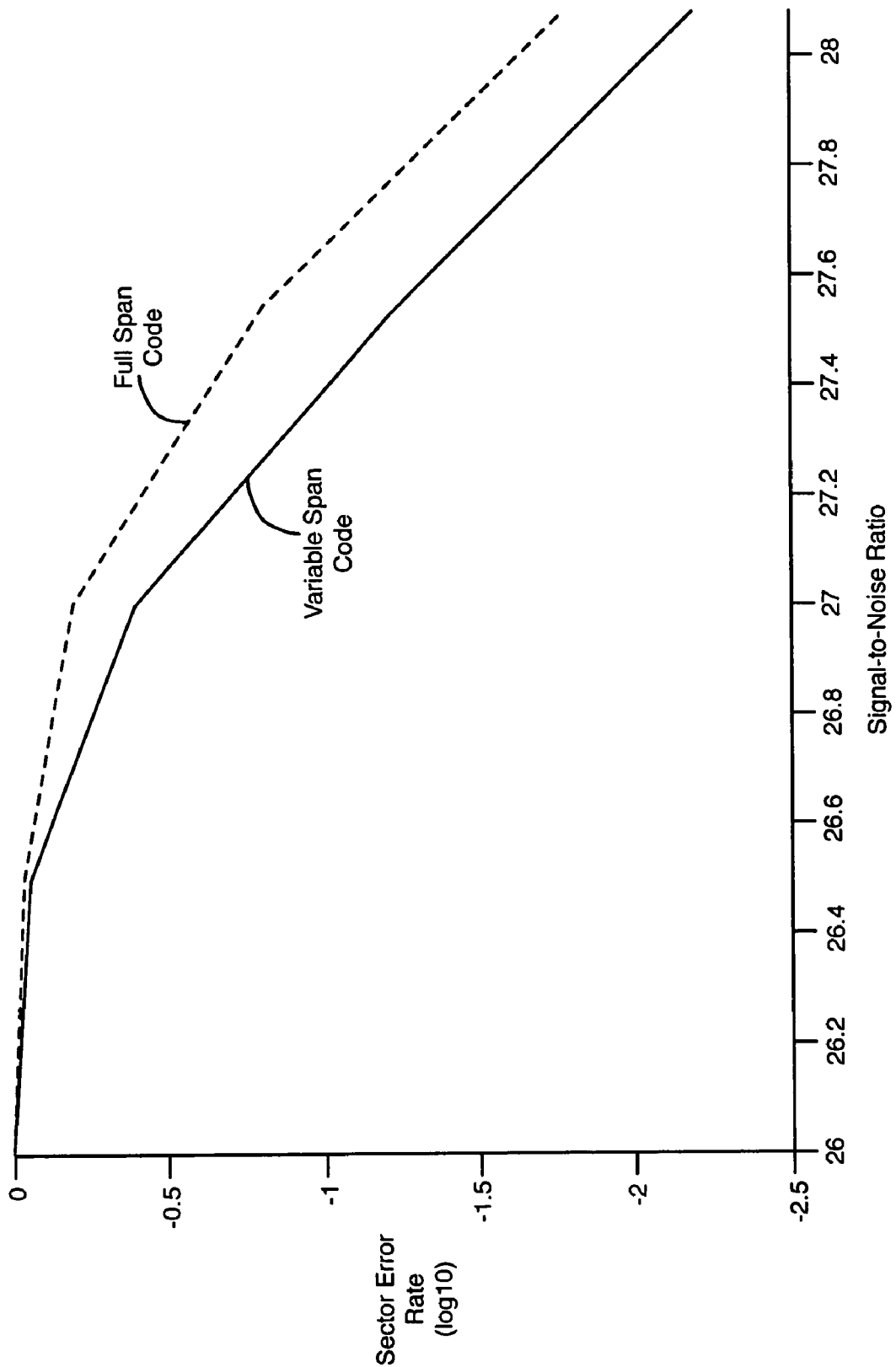
FIG. 4 is a chart showing an example of simulation results for the 20/21 Fibonacci base shown, in part, in FIG. 2.

FIG. 4 is a chart showing an example of simulation results for the 20/21 Fibonacci code shown, in part, in FIG. 2. The simulation results shown in FIG. 4 illustrate an improvement in error rate that is provided by a variable span modulation code of the present invention. The dotted line in FIG. 4 plots the variation in the sector error rate for different signal-to-noise ratios using a standard code having a fixed span. The solid lines plot the variation in the sector error rate for a variable span code of the present invention.

As can be seen in FIG. 4, a variable span code of the present invention can significantly reduce the sector error rate at increasing signal-to-noise ratios. For a given sector error rate, the variable span code outperforms the fixed span code by about 0.2 dB. The simulation results shown in FIG. 4 were generated using 100% electrical noise and a Lorentian Du=3.2.

The foregoing description of the exemplary embodiments of the invention has been presented for the purposes of illustration and description. It is not intended to be exhaustive or to limit the invention to the precise form disclosed. A latitude of modification, various changes, and substitutions are intended in the present invention. In some instances, features of the invention can be employed without a corresponding use of other features as set forth. Many modifications and variations are possible in light of the above teachings, without departing from the scope of the invention. For instance, although the present invention has been illustrated with 10-bit bytes, its extension to other bytes sizes, such as 12-bit bytes, is clear. The present invention can also include Fibonacci modulation codes that provide other code rates, such as 24/25, 36/37, 48/49, etc. It is intended that the scope of the invention be limited not with this detailed description, but rather by the claims appended hereto.

What is claimed is:

1. A system for imposing modulation constraints on input sequences to remove a subset of the input sequences, the system comprising:
   a modulation encoder that encodes input sequences to generate encoded sequences using a Fibonacci base having a variable span; and
   a modulation decoder that decodes the encoded sequences using the Fibonacci base to generate decoded sequences.

2. The system defined in claim 1 wherein a subset of elements in the base have a limited span that prevents errors occurring in a corresponding subset of bit positions in the encoded sequences from propagating to adjacent bytes in the decoded sequence.

3. The system defined in claim 1 wherein the modulation encoder is preceded by a Reed-Solomon encoder.

4. The system defined in claim 3 wherein the Reed-Solomon byte size is equal to 10.

5. The system defined in claim 4 wherein the modulation encoder generates a code rate of 10 k/(10 k+1), where k is a positive integer k=1,2 . . . .

6. The system defined in claim 3 wherein the Reed-Solomon byte size is equal to 12.

7. The system defined in claim 6 wherein the modulation encoder generates a code rate of 12 k/(12 k+1), where k is a positive integer k=1,2 . . . .

8. The system defined in claim 1 wherein the modulation encoder generates a code rate of 24/25.

9. The system defined in claim 1 wherein the modulation encoder generates a code rate of 36/37.

10. The system defined in claim 1 wherein the modulation encoder and modulation decoder are implemented by a controller in a hard disk drive.

11. The system defined in claim 1 wherein the modulation encoder and modulation decoder are implemented by a controller for a data communication system.

12. A method for imposing modulation constraints on input sequences to remove a set of forbidden input sequences, the method comprising:
   encoding the input sequences with a modulation encoder to generate encoded sequences using a Fibonacci base with a variable span; and
   decoding the encoded sequences with a modulation decoder to generate decoded sequences using the Fibonacci base, wherein a subset of elements in the base have a limited span that prevents errors occurring in a corresponding subset of bit positions in the encoded sequences from propagating to adjacent bytes in the decoded sequences.

13. The method defined in claim 12 further comprising:
   encoding a bit stream using a Reed-Solomon code to generate the input sequences before being provided to the modulation encoder.

14. The method defined in claim 12 wherein encoding the input sequences using the modulation encoder to generate the encoded sequences further comprises encoding the input sequences using the modulation encoder to provide a code rate of 10 k/(10 k+1), where k is a positive integer k=1,2 . . . .

15. The method defined in claim 12 wherein encoding the input sequences using the modulation encoder to generate the encoded sequences further comprises encoding the input sequences using the modulation encoder to provide a code rate of 12 k/(12 k+1), where k is a positive integer k=1,2 . . . .

16. The method defined in claim 12 wherein encoding the input sequences and decoding the encoded sequences are performed by a chipset in a hard disk drive system.

17. A controller for imposing modulation constraints on input sequences, the controller comprising:
- a modulation encoder that encodes input sequences to generate encoded sequences using a Fibonacci base having a variable span; and
- a modulation decoder that decodes the encoded sequences using the Fibonacci base to generate decoded sequences, wherein a subset of elements in the Fibonacci base have a limited span that prevents errors occurring in bit positions of the encoded sequences that correspond to the subset of elements from propagating to adjacent bytes in the decoded sequences.

18. The controller defined in claim 17 wherein the controller is part of a hard disk drive system.

19. The controller defined in claim 17 wherein the modulation encoder is preceded by a Reed-Solomon encoder.

20. The controller defined in claim 17 wherein the modulation encoder and modulation decoder are implemented for a data communication system.

* * * * *